United States Patent [19]
Shigeta

[11] Patent Number: 5,279,861
[45] Date of Patent: Jan. 18, 1994

[54] METHOD OF COATING A THIN PHOTOSENSITIVE OR PROTECTIVE FILM ON A PRINTING ROLL

[75] Inventor: Kaku Shigeta, Chiba, Japan

[73] Assignee: Think Laboratory Co., Ltd., Chiba, Japan

[21] Appl. No.: 586,010

[22] Filed: Sep. 21, 1990

[30] Foreign Application Priority Data

Sep. 21, 1989 [JP] Japan .................. 1-246049

[51] Int. Cl.$^5$ .................. B05D 1/28
[52] U.S. Cl. .................. 427/402; 427/428; 118/258; 118/262
[58] Field of Search ........... 118/210, 258, 268, 264, 118/262; 427/428, 429, 402

[56] References Cited

U.S. PATENT DOCUMENTS

| | | | |
|---|---|---|---|
| Re. 24,854 | 8/1960 | Knight | 118/268 |
| 2,068,141 | 1/1937 | Kramer et al. | 118/262 |
| 2,092,498 | 9/1937 | Card, Jr. | 118/262 |
| 2,813,292 | 11/1957 | McLendon | 118/528 X |
| 3,136,659 | 6/1964 | Walker et al. | 118/258 X |
| 4,661,380 | 4/1987 | Tillotson | 427/428 X |

Primary Examiner—Shrive Beck
Assistant Examiner—Katherine A. Bareford
Attorney, Agent, or Firm—Koda and Androlia

[57] ABSTRACT

A coating method is performed by positioning a coating roll directly beneath one end of a predetermined coating range of a printing roll so that the coating roll is perpendicular to the printing roll. The rotating roll rotates and carries a coating liquid which is to be coated on the printing roll that is held horizontally. The printing roll is rotated, and the coating roll is also rotated in a direction in which the carrying of the coating liquid takes place on a leading side of the rotating roll with respect to the traveling direction of the coating roll. The coating roll and is moved from one end to the other of the coating range on the printing roll in such a manner that the coating roll is kept in contact with the printing roll and the coating liquid is coated on the printing roll.

4 Claims, 1 Drawing Sheet

METHOD OF COATING A THIN PHOTOSENSITIVE OR PROTECTIVE FILM ON A PRINTING ROLL

BACKGROUND OF THE INVENTION

1. Field of Industrial Utilization of the Invention

The present invention relates to a coating method, which is used in the manufacture of printing plates such as gravure printing rolls, etc., for coating a roll that is to be made into a printing plate (called "printing roll" hereafter) with an extremely thin and uniform photosensitive film and for further coating a transparent protective film consisting of polyvinyl alcohol etc., after the photosensitive film has been coated.

2. Prior Art

Conventionally, coating of photosensitive film on a printing roll that is to be made into printing plates has been accomplished by an apparatus described in Japanese Patent Publication (Kokoku) No. 58-29471. Specifically, an annular dish which has a rubber seal formed around its interior circumference is fit over the printing roll (that is to be made into a printing plate). The printing roll is then set in a vertical position and held by a chucking means at its upper and lower ends. The annular dish is positioned at the upper end of the printing roll, and a photosensitive liquid is poured into the annular dish. The annular dish, connected to a raising/lowering device, is lowered, and when the annular dish has reached the lower end of the printing roll, lowering of the dish is stopped. Then, the photosensitive liquid remaining in the dish is recovered.

However, if coating is performed by the above-described apparatus and photosensitive liquid for laser exposure processes is used, the resulted film is so thick that a desirable laser exposure is not accomplished. Accordingly, a development of a coating technique which performs coating on a printing roll with a much thinner, uniform photosensitive film is demanded. Also, a coating technique wherein a transparent protective film consisting of polyvinyl alcohol, etc. is coated after the photosensitive film has been coated is demanded. Unlike conventional photosensitive liquids, the photosensitive liquids which are used in laser exposure processes require an overcoating with a transparent protective film consisting of polyvinyl alcohol, etc. In this case as well, an extremely thin and uniform coating is required.

In the effort to develop such a coating technique, an application method of an ink layer to printing rolls, a paste printing method used to paste two packaging films together, and a coating material printing method used for coated rolls in papermaking machines, were studied in order to determine whether or not such methods could be utilized to solve the problems. In all of these methods, however, since the rolls are not ideally parallel, uniform roll contact was not obtained for the entire length of the roll. Accordingly, since it is impossible to perform a coating operation so that the thickness of the coating film is uniform, fatal drawback such as those below. At the point where the contact with the printing roll (that is to be made into a printing plate) is released, the coating liquid is transferred to the printing roll, accumulating linearly too thickly.

SUMMARY OF THE INVENTION

The present invention was proposed in light of the points described above. The present invention is to provide a coating method which, in the manufacture of printing plates such as gravure printing rolls, etc., can coat a printing roll with an extremely thin and uniform photosensitive film and further apply a transparent protective film consisting of polyvinyl alcohol etc., after the coating of the photosensitive film is accomplished.

According to the present invention, the following means are taken to solve the above-described problems:

A coating roll is positioned directly beneath one end of a predetermined coating range of a printing roll in a manner that the axis of the coating roll is oriented perpendicular, when viewed from the top, to the axis of the printing roll so that the coating roll rotates with a predetermined coating liquid thereon that is coated on the printing roll which is chucked at both ends in a horizontal position; and the printing roll is rotated at a predetermined speed, and the coating roll is also rotated at a predetermined speed in a predetermined direction in which the carrying of the coating liquid takes place on the leading side of the coating roll with respect to the direction of travel or move of the coating roll so that the coating roll moves from one end to the other end of a coating range on the printing roll while in contact with the printing roll, thus coating the coating liquid on the printing roll.

Since the coating liquid is carried on the leading side of the coating roll with respect to the direction of travel of the coating roll along the printing roll, the coating liquid is carried into a slipping contact area between the coating roll and the printing roll. Therefore, this coating liquid is applied by the coating roll so as to be printed on the printing. Since the coating is performed with the coating roll caused to move along the length of the printing roll R while in contact with the undersurface of the printing roll R, coating is done in spiral form with the adjacent tracks of the spiral overlapping so that no uncoated portions remain. Accordingly, since uniform coating conditions are maintained throughout the entire coating range on the printing roll, the printing roll can be coated with an extremely thin and uniform photosensitive film, and a transparent protective film consisting of polyvinyl alcohol, etc. can be further applied following the previous coating step of the photosensitive film.

DETAILED DESCRIPTION OF THE INVENTION

Figure 1:
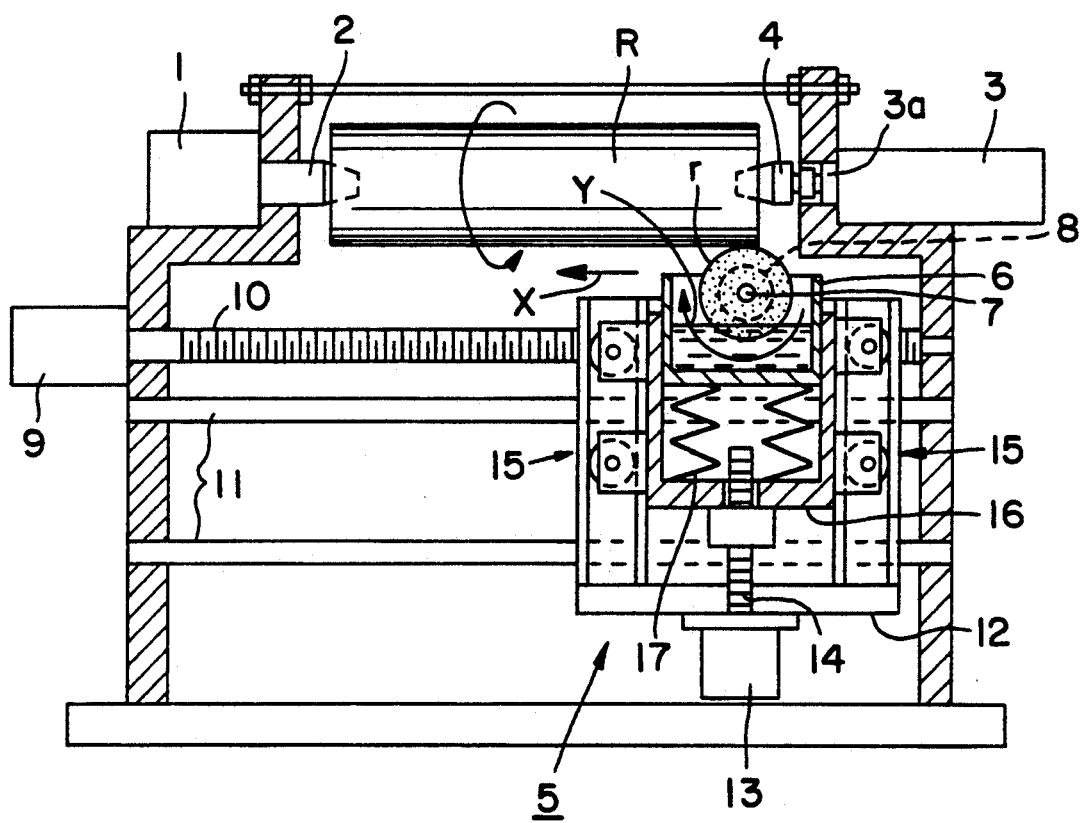
FIG. 1 is a longitudinal sectional view of a coating apparatus constructed in conceptual terms for the purpose of using the coating method of the present invention.

In FIG. 1, a roll R that is to be made into a printing plate (called "printing roll") is chucked at both ends in a horizontal position by a rotary chucking and turning means. This chucking and turning means comprises a spindle chuck 2 connected to a motor 1 and a spindle chuck 4 rotatably connected to a piston 3a of a cylinder device 3.

A coating roll r is mounted to a horizontal shaft 7. The shaft 7 passes through the side walls of a tank 6 provided on a two-dimensional table 5 so as to be urged upward. The coating roll r is installed so that it is immersed in a coating liquid which is contained in the tank 6. The coating roll r is caused to rotate by a motor 8 at a predetermined speed in a predetermined rotational direction (i.e. in the arrow Y direction) so that the carrying of the coating liquid takes place on the leading side of the coating roll r with respect to the direction of travel of the roll r (i.e., in the arrow X direction).

Accordingly, the coating roll r is positioned directly beneath the printing roll R, (that is to be made into a printing plate), in such a manner that the axis of the coating roll r is perpendicular, when viewed from the top, to the axis of the printing roll R.

The two-dimensional table 5 is provided with a horizontally moving table 12. This table 12 is engaged with a horizontal feed screw 10 that is connected to a motor 9 and guided by a horizontal guide 11. The table 5 is provided also with a vertically moving table 16, and this table 16 is engaged with a vertical feed screw 14. The feed screw 14 is connected to a motor 13 that is installed underneath the horizontally moving table 12 and guided by a vertical guide 15.

The vertically moving table 16 is formed in the shape of a frame. The table 16 accommodates the tank 6 therein and guides the tank 6 to move up and down. A spring 17 is installed underneath the tank 6 and urges the tank 6 upward.

The printing roll R (that is to be made into a printing plate) is caused to rotate at a predetermined speed. At the same time, the coating roll r is positioned directly beneath one end of the coating range of the printing roll R, and the coating roll r is caused to rotate at a predetermined direction of rotation. In this way, the carrying of the coating liquid takes place on the leading side of the coating roll r with respect to the direction of travel of the roll r. The coating roll r is next raised, and a slight urging force is applied so that the coating roll r is caused to contact with one end of a coating range on the printing roll R. The coating roll r is then caused to travel at a predetermined speed to the other end of the coating range. After this, the rotational speed of the coating roll r is reduced to a predetermined level, or the rotation of the coating roll r is stopped. The rotation of the printing roll R is also stopped, the chucking of the printing roll R is released, and the printing roll R is conveyed elsewhere.

The urging force of the tank 6 in the upward direction by the spring 17 causes the coating roll r to contact the printing roll R at a more or less even pressure even though the printing roll R is not a precisely parallel (or a cylindrical) roll. Thus, a coating with an extremely uniform film thickness will be obtained. The reason for making a contact between the coating roll r and the printing roll R after the two rolls have been caused to rotate is to insure that there will be no transfer of a large amount of coating liquid carried by the coating roll r at the point where the coating has initiated. Also, the reason for slowing down the rotational speed of the coating roll r to a predetermined level or stopping the rotation of the coating roll at the other end of the coating range on the printing roll R is to cut off the supply of the coating liquid carried by the coating roll r so that a large amount of the carried coating liquid is not transferred and to rub away the coating film.

Since the carrying of the coating liquid on the coating roll r takes place on the leading side of the coating roll r with respect to the direction of travel (or move) of the coating roll r, the coating liquid is carried into the area of slipping contact between the coating roll r and the printing roll R. The coating liquid is printed on the printing roll R by the coating roll r. Thus, coating is performed so that no uncoated areas remains in the coating range of the printing roll R. Since uniform coating conditions can be maintained throughout the entire coating range of the printing roll R, the printing roll R can be coated with an extremely thin and uniform photosensitive film, and a transparent film consisting of polyvinyl alcohol, etc. can be coated after the coating of the photosensitive film.

MERIT

According to the method of the present invention as described above, it is possible (when manufacturing printing plates such as gravure printing rolls, etc.) to coat the printing roll R with an extremely thin and uniform photosensitive film and to further coat a transparent protective film consisting of polyvinyl alcohol, etc. after the coating of the photosensitive film. The initial object of the present invention is thus achieved.

EFFECT

As an experimental example, a coating apparatus of the type disclosed in the accompanying drawing that illustrates the embodiment was prepared. A coating roll r made of sponge (diameter: 130 mm; width: 35 mm) was installed therein. A printing roll R with a diameter of 490 mm was held chucked, and a coating test that involves photosensitive films for use in laser exposure processes was performed using various values of the rotational speed of the roll R and the rotational speed and traveling speed of the coating roll r. The rotational speed of the coating roll r was set at 60 rpm, the circumferential speed of the printing roll R was set at 0.3 m/s, and the rate of travel of the coating roll r was set at 257 mm/min, and the result was that the printing roll R was finished in spiral form with a finishing width of approximately 7 mm, and the entire surface of the printing roll R was coated with an extremely thin and uniform photosensitive film.

What is claimed:

1. A method of coating a printing roller with a film of a liquid characterized by:

rotating a printing roll which is chucked at both ends at a first speed;

bringing a coating roll immersed in a coating liquid contained in a tank into contact with one end of said printing roll in such a manner that an axis of said coating roll is oriented perpendicular, when viewed from the above, to an axis of said printing roll; and rotating and moving said coating roll at a second speed toward another end of said printing roll in such a manner that carrying of said coating liquid takes place on a leading side of said coating roll with respect to a traveling direction of said coating roll, said tank being provided in a table that is reciprocally movable beneath and along said printing roll and is raised and lowered and further being supported by springs so as to be urged in a vertical direction, whereby said coating liquid is applied spirally onto said printing roll without leaving any vacant space.

2. A method according to claim 1, wherein said coating liquid is a photosensitive liquid to be formed into a photosensitive film when coated on said printing roll.

3. A method according to claim 2, wherein said coating liquid is a protective liquid to be formed into a protective film for protecting said photosensitive film coated on said printing roll.

4. A method according to claim 2 wherein said coating roll is made of sponge, has a diameter of 130 mm and a width of 35 mm, said print roll has a diameter of 490 mm, the coating roll rotates at 60 rpm and the coating roll moves at 257 mm/min.

* * * * *